(12) United States Patent
Qiao et al.

(10) Patent No.: US 10,680,204 B2
(45) Date of Patent: Jun. 9, 2020

(54) ENCAPSULATION STRUCTURE, SUBSTRATE AND DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zi Qiao, Beijing (CN); Zhiliang Jiang, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/476,402

(22) PCT Filed: Dec. 11, 2018

(86) PCT No.: PCT/CN2018/120315
§ 371 (c)(1),
(2) Date: Jul. 8, 2019

(87) PCT Pub. No.: WO2019/114699
PCT Pub. Date: Jun. 20, 2019

(65) Prior Publication Data
US 2020/0052245 A1 Feb. 13, 2020

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01)

(58) Field of Classification Search
CPC ..... H01L 27/32; H01L 27/3246; H01L 51/52; H01L 51/5253; H01L 51/56
See application file for complete search history.

(56) References Cited

U.S. PATENT DOCUMENTS 9,196,804 B2 * 11/2015 Cho .................. H01L 33/56
9,748,518 B2    8/2017 Zeng et al.
(Continued)

FOREIGN PATENT DOCUMENTS

CN       105118933 A       12/2015
CN       105140417 A       12/2015
(Continued)

OTHER PUBLICATIONS

International Search Report and Written Opinion dated Mar. 14, 2019.

*Primary Examiner* — Allan R Wilson
(74) *Attorney, Agent, or Firm* — Dilworth & Barrese, LLP.; Michael J. Musella, Esq.

(57) ABSTRACT

Disclosed are an encapsulation structure, a substrate and a display panel. The package structure includes an encapsulation layer and a transition layer, wherein the encapsulation layer includes a first encapsulation layer and a second encapsulation layer which are laminated with each other, the first encapsulation layer is located on a first main surface of the second encapsulation layer, the transition layer and the first encapsulation layer are juxtaposed on the first main surface, the first main surface includes a first region in contact with the first encapsulation layer and a second region in contact with the transition layer, the second region is located at an edge of the first main surface, and a bonding strength between the transition layer and the second encapsulation layer is greater than a bonding strength between the first encapsulation layer and the second encapsulation layer.

20 Claims, 4 Drawing Sheets

(56) References Cited

U.S. PATENT DOCUMENTS

| | | | |
|---|---|---|---|
| 9,891,475 B2* | 2/2018 | Lee | G02F 1/1339 |
| 10,181,578 B2 | 1/2019 | Li et al. | |
| 10,446,792 B2 | 10/2019 | Xie et al. | |
| 2004/0263740 A1* | 12/2004 | Sakakura | H01L 51/5237 |
| | | | 349/138 |
| 2016/0226026 A1* | 8/2016 | Kwak | H01L 51/5253 |
| 2018/0040837 A1* | 2/2018 | Seo | H01L 27/3258 |
| 2018/0151833 A1* | 5/2018 | Riegel | H01L 51/5253 |
| 2020/0006714 A1* | 1/2020 | Zhang | H01L 51/52 |
| 2020/0044185 A1* | 2/2020 | Wu | H01L 27/32 |

FOREIGN PATENT DOCUMENTS

| | | | |
|---|---|---|---|
| CN | 105355647 A | 2/2016 | |
| CN | 107359267 A | 11/2017 | |
| WO | WO-2016086538 A1 * | 6/2016 | H01L 51/56 |

* cited by examiner

ENCAPSULATION STRUCTURE, SUBSTRATE AND DISPLAY PANEL

This application claims the priority of Chinese patent application No. 201711353503.7 filed on Dec. 15, 2017, the disclosure of which is incorporated herein in its entirety as a part of this application.

TECHNICAL FIELD

At least one embodiment of the present disclosure relates to an encapsulation structure, a substrate, and a display panel.

BACKGROUND

An Organic light-emitting diode (OLED) is an organic thin film electroluminescent member, which has attracted great attention owing to its advantages of simple preparation process, low cost, low power consumption, high brightness, wide viewing angle, high contrast and flexible display.

In the actual process, an encapsulation layer is arranged in an OLED electronic display product to prevent internal components from being damaged due to the influence of water vapor, oxygen and the like penetrating into the interior, but the current encapsulation layer has a limited bonding strength and is easy to fall off, thus affecting the encapsulation effect of the encapsulation layer and reducing the yield of the OLED electronic display product.

SUMMARY

At least one embodiment of the present disclosure provides a substrate, comprising a base and an encapsulation structure that is located on the base; the encapsulation structure comprises an encapsulation layer and a transition layer; the encapsulation layer comprises a first encapsulation layer and a second encapsulation layer which are sequentially laminated on the base, wherein the first encapsulation layer is located on a first main surface of the second encapsulation layer, the transition layer and the first encapsulation layer are juxtaposed on the first main surface, the first main surface includes a first region in contact with the first encapsulation layer and a second region in contact with the transition layer, the second region is located at an edge of the first main surface, and a bonding strength between the transition layer and the second encapsulation layer is greater than a bonding strength between the first encapsulation layer and the second encapsulation layer.

For example, in the substrate provided by at least one embodiment of the present disclosure, an orthographic projection of the transition layer on a plane where the substrate is located is located outside an orthographic projection of the first encapsulation layer on the plane where the substrate is located.

For example, in the substrate provided by at least one embodiment of the present disclosure, the preparation materials of the second encapsulation layer and the transition layer both include organic materials.

For example, in the substrate provided by at least one embodiment of the present disclosure, an orthographic projection of the second region on the plane where the substrate is located is in a closed ring shape, and an orthographic projection of the first region on the plane where the substrate is located is located within an orthographic projection of the second region on the plane where the substrate is located.

For example, in the substrate provided by at least one embodiment of the present disclosure, the surface of the transition layer in contact with the first main surface is provided with at least one concave-convex structure.

For example, in the substrate provided by at least one embodiment of the present disclosure, the concave-convex structure is arranged in multiple layers in a direction from an edge of the first main surface to a center of the first main surface.

For example, in the substrate provided by at least one embodiment of the present disclosure, in a direction perpendicular to the plane where the substrate is located, a cross-sectional shape of the concave-convex structure includes one or a combination of an arc, a rectangle, a trapezoid and an inverted trapezoid.

For example, the substrate provided by at least one embodiment of the present disclosure further includes: a dielectric layer disposed at a side of the transition layer away from the second encapsulation layer, and the bonding strength between the dielectric layer and the transition layer is greater than the bonding strength between the dielectric layer and the first encapsulation layer.

For example, in the substrate provided by at least one embodiment of the present disclosure, a preparation material of the dielectric layer comprises an organic material, and the dielectric layer is one of a buffer layer, a gate insulating layer, an interlayer dielectric layer, a passivation layer, a planarization layer and a pixel defining layer in the substrate.

For example, in the substrate provided by at least one embodiment of the present disclosure, the transition layer is configured to be disposed in a same layer and made of a same material as one or a combination of a gate insulating layer, an interlayer dielectric layer, a passivation layer, a planarization layer and a pixel defining layer in the substrate.

For example, in the substrate provided by at least one embodiment of the present disclosure, in the second region, the ratio of the thickness of the transition layer to the thickness of the second encapsulation layer is from $\frac{1}{6}$ to $\frac{1}{3}$.

For example, the substrate provided by at least one embodiment of the present disclosure further includes: a third encapsulation layer disposed at a side of the second encapsulation layer away from the first main surface, and the preparation materials of the first encapsulation layer and the third encapsulation layer include inorganic materials.

For example, in the substrate provided by at least one embodiment of the present disclosure, an orthographic projection of the second encapsulation layer on a plane where the substrate is located and an orthographic projection of the transition layer on the plane where the substrate is located are both located within an orthographic projection of the third encapsulation layer on the plane where the substrate is located.

For example, the substrate provided by at least one embodiment of the present disclosure further includes: a barrier dam located at a side of the transition layer away from the first encapsulation layer; wherein an orthographic projection of the barrier dam on a plane where the substrate is located is located within an orthographic projection of the third encapsulation layer on the plane where the substrate is located, and at least a portion of the barrier dam is disposed in a same layer and made of a same material as the transition layer.

At least one embodiment of the present disclosure provides a display panel, including the substrate according to any one of the foregoing embodiments.

At least one embodiment of the present disclosure provides an encapsulation structure, comprising an encapsulation layer and a transition layer, wherein the encapsulation layer comprises a first encapsulation layer and a second encapsulation layer which are laminated with each other, the first encapsulation layer is located on a first main surface of the second encapsulation layer, the transition layer and the first encapsulation layer are juxtaposed on the first main surface, the first main surface comprises a first region in contact with the first encapsulation layer and a second region in contact with the transition layer, the second region is located at the edge of the first main surface, and the bonding strength between the transition layer and the second encapsulation layer is greater than the bonding strength between the first encapsulation layer and the second encapsulation layer.

For example, in the encapsulation structure provided by at least one embodiment of the present disclosure, an orthographic projection of the transition layer on the first main surface is located outside an orthographic projection of the first encapsulation layer on the first main surface.

For example, in the encapsulation structure provided by at least one embodiment of the present disclosure, the materials of the second encapsulation layer and the transition layer both include organic materials.

For example, in the encapsulation structure provided by at least one embodiment of the present disclosure, an orthographic projection of the second region on the first main surface is in a closed ring shape, and an orthographic projection of the first region on a plane where the substrate is located is located within an orthographic projection of the second region on the first main surface.

For example, in the encapsulation structure provided by at least one embodiment of the present disclosure, the surface of the transition layer in contact with the first main surface is provided with at least one concave-convex structure.

BRIEF DESCRIPTION OF THE DRAWINGS

In order to explain the technical scheme of the embodiments of the present invention more clearly, the drawings of the embodiments will be briefly introduced herein below. Obviously, the drawings described below only refer to some embodiments of the present invention, and are not limitative of the present invention.

Figure 1:
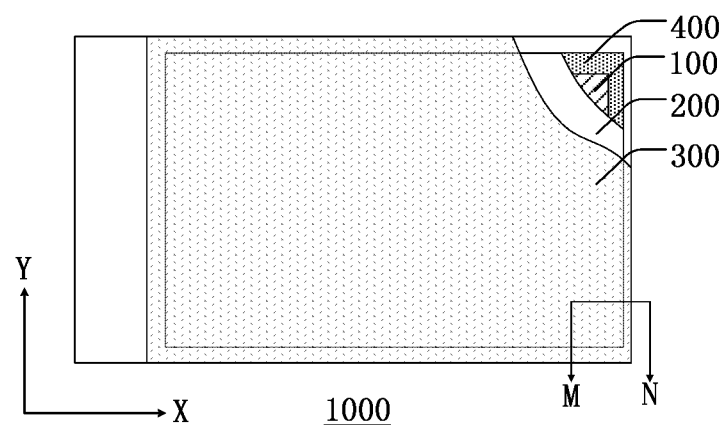
FIG. 1 is a plan view of a substrate according to an embodiment of the present disclosure.

REFERENCE SIGNS 10-encapsulation structure; 100-first encapsulation layer; 200-second encapsulation layer; 210-first main surface; 211-first region; 212-second region; 300-third encapsulation layer; 400-transition layer; 410-concave-convex structure; 500-base; 600-dielectric layer; 700-barrier dam; 1000-substrate.

DETAILED DESCRIPTION

In order to make the objects, technical solutions and advantages of the embodiments of the present invention clearer, the technical solutions of the embodiments of the present invention will be described clearly and completely with reference to the drawings of the embodiments of the present invention. Apparently, the embodiments described are only part but not all of the embodiments of the present invention. Based on the embodiments described herein, all the other embodiments obtained by a person of ordinary skill in the art without any inventive work should be within the scope of protection of the present invention.

Unless otherwise defined, the technical or scientific terms used in the present disclosure shall have the meanings as commonly understood by one of ordinary skill in the art to which the present invention belongs. The terms "first," "second," and the like which are used in the present disclosure are not intended to indicate any sequence, amount or importance, but to distinguish various components. Likewise, the terms "comprise," "comprising," "include," "including," and the like are intended to specify that the elements or objects stated before these terms encompass the elements or objects and equivalents thereof listed after these terms, and do not preclude the other elements or objects. The terms "connect", "connected", and the like are not intended to define physical or mechanical connection, but may include electrical connection, either directly or indirectly. "On," "below," "left," "right" and the like are only used to indicate a relative position relationship, and if the absolute position of the object described is changed, the relative position relationship may be changed accordingly.

At least one embodiment of the present disclosure provides a substrate, and the substrate comprises a base and an encapsulation structure that is located on the base. The encapsulation structure comprises an encapsulation layer and a transition layer, wherein the encapsulation layer comprises a first encapsulation layer and a second encapsulation layer which are sequentially stacked on the base; the first encapsulation layer is located on a first main surface of the second encapsulation layer; the transition layer and the first encapsulation layer are juxtaposed on the first main surface; the first main surface comprises a first region in contact with the first encapsulation layer and a second region in contact with the transition layer; the second region is located at an edge of the first main surface; and a bonding strength between the transition layer and the second encapsulation layer is greater than a bonding strength between the first encapsulation layer and the second encapsulation layer. The transition layer can improve the adhesion of the edge portion of the second encapsulation layer and prevent the second encapsulation layer from being separated from the substrate, thus improving the encapsulation yield of the substrate.

The encapsulation structure, the substrate, and the display panel according to at least one embodiment of the present disclosure will be described below with reference to the drawings.

Figure 2:
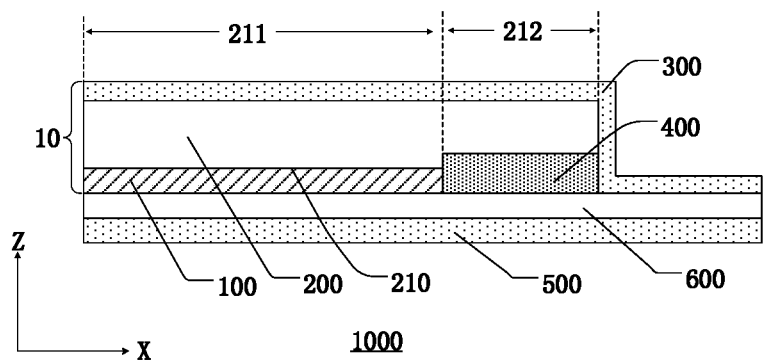
FIG. 2 is a cross-sectional view of the substrate shown in FIG. 1 along M-N.

FIG. 1 is a plan view of a substrate according to an embodiment of the present disclosure, and FIG. 2 is a cross-sectional view of the substrate shown in FIG. 1 along M-N.

For example, at least one embodiment of the present disclosure provides a substrate. As shown in FIG. 1 and FIG. 2, the substrate 1000 comprises a base 500 and an encapsulation structure 10 that is disposed on the base 500. The encapsulation structure 10 comprises an encapsulation layer and a transition layer 400, the encapsulation layer comprises a first encapsulation layer 100 and a second encapsulation layer 200 which are sequentially stacked on the base 500, the first encapsulation layer 100 is located on a first main surface 210 of the second encapsulation layer 200 (e.g., a main surface of the second encapsulation layer 200 facing the base 500), the transition layer 400 and the first encapsulation layer 100 are juxtaposed on the first main surface 210, the first main surface 210 comprises a first region 211 in contact with the first encapsulation layer 100 and a second region 212 in contact with the transition layer 400, the second region 212 is located at an edge of the first main surface 210, and the bonding strength between the transition layer 400 and the second encapsulation layer 200 is greater than the bonding strength between the first encapsulation layer 100 and the second encapsulation layer 200.

For example, in at least one embodiment of the present disclosure, a preparation material of the first encapsulation layer 100 may be an inorganic material, such as silicon nitride, silicon oxide, silicon oxynitride, or any other suitable material. The inorganic material has a high compactness, which can prevent water, oxygen and the like from invading the interior of the substrate 1000. For example, the preparation material of the second encapsulation layer 200 may be an organic material such as a polymer resin (e.g., polyimide, polyacrylate, polyacrylate polyurethane, polyurea or aromatic polyester), etc. The second encapsulation layer 200 has functions of planarization, stress relaxation, etc. In addition, materials such as a desiccant may be disposed in the second encapsulation layer 200, to absorb substances such as water and oxygen invading the interior so as to further protect components in the substrate 1000.

Generally, the bonding force between an organic material and an inorganic material is weak, and separation may readily occur. If the transition layer 400 is not provided, the first encapsulation layer 100 will cover all of the first main surface 210 of the second encapsulation layer 200. In the actual application process, under a condition that the substrate 1000 is affected by an external force such as bending, the stress will usually be concentrated in an edge region of the first encapsulation layer 100 and the second encapsulation layer 200. The mismatch of the materials of the first encapsulation layer 100 and the second encapsulation layer 200 will lead to a stress difference between them, thus making it easy for the first encapsulation layer 100 and the second encapsulation layer 200 to be separated at an edge. In addition, a thickness of the second encapsulation layer 200 made of an organic material is generally greater than a thickness of the first encapsulation layer 100 made of an inorganic material, thus further increasing the stress difference between the first encapsulation layer 100 and the second encapsulation layer 200 and increasing the risk of separation of the second encapsulation layer 200 from the substrate 1000.

For example, in at least one embodiment of the present disclosure, the preparation material of the transition layer 400 may include an organic material such as a polymer resin (e.g., polyimide, polyacrylate, polyacrylate polyurethane, polyurea or aromatic polyester), etc. The transition layer 400 is disposed at an edge of the second encapsulation layer 200 (e.g., in the second region 212). The bonding force between the transition layer 400 and the second encapsulation layer 200 is great, so that an edge portion of the second encapsulation layer 200 can be firmly attached to the substrate 1000, and the first encapsulation layer 100 can still prevent water, oxygen, and the like from invading the interior of the substrate 1000 without affecting the encapsulation yield of the substrate 1000.

As shown in FIG. 1 and FIG. 2, a spatial rectangular coordinate system is established with reference to the base 500 in the substrate to explain the positions of various components in the substrate 1000. In this spatial rectangular coordinate system, the directions of the X axis and the Y axis are parallel to a plane on which the substrate 1000 is located (e.g., a plane on which the base 500 is located), and the Z axis is perpendicular to the plane on which the base 500 is located.

For example, in the substrate provided by at least one embodiment of the present disclosure, an orthographic projection of the transition layer on the plane where the substrate is located is located outside an orthographic projection of the first encapsulation layer on the plane where the substrate is located. For example, as shown in FIG. 1 and FIG. 2, the orthographic projection of the transition layer 400 on the plane where the substrate 1000 is located is located outside the orthographic projection of the first encapsulation layer 100 on the plane where the substrate 1000 is located, so that the first encapsulation layer 100 and the transition layer 400 are juxtaposed on the main surface 210 of the second encapsulation layer 200 and the first encapsulation layer 100 and the transition layer 400 are overlapped with each other. As a consequence, the first encapsulation layer 100 does not affect the bonding between the second encapsulation layer 200 and the transition layer 400.

For example, in the substrate provided by at least one embodiment of the present disclosure, the first encapsulation layer 100 and the transition layer 400 are juxtaposed on the first main surface 210 of the second encapsulation layer 200. For example, further, there is no spacing between the first encapsulation layer 100 and the transition layer 400, that is, the first encapsulation layer 100 and the transition layer 400 are in contact with each other.

For example, in the substrate provided by at least one embodiment of the present disclosure, the preparation materials of the second encapsulation layer and the transition layer may both include organic materials. Illustratively, as shown in FIG. 1 and FIG. 2, the preparation materials of the second encapsulation layer 200 and the transition layer 400 both include organic materials, and the bonding strength between the organic materials is great, so that the bonding between the second encapsulation layer 200 and the transition layer 400 is firm. Factors that affect the bonding strength (bonding force) may include an intermolecular force. The intermolecular force between materials of the same type is greater, and the type may be organic or inorganic. For example, the intermolecular force between the organic material and the organic material, and the intermolecular force between the inorganic material and the inorganic material are usually greater than the intermolecular force between the organic material and the inorganic material. As such, the bonding strength between the inorganic film layer and the inorganic film layer, and the bonding strength between the organic film layer and the organic film layer are generally greater than the bonding strength between the organic film layer and the inorganic film layer.

In at least one embodiment of the present disclosure, a distribution of the transition layer on the first main surface of the second encapsulation layer is not limited as long as an arrangement of the transition layer can reduce the risk of separation of the second encapsulation layer from the substrate. For example, in some embodiments of the present disclosure, a plurality of transition layers (or second regions) may be provided and arranged at intervals at the edge of the first main surface. For example, in other embodiments of the present disclosure, in a direction parallel to the plane where the substrate is located, the second region may be a closed ring, and the first region is located within the second region. For example, as shown in FIG. 1 and FIG. 2, the second region 212 is a closed ring and is located at the edge of the first main surface 210, the first region 211 is located within the second region 212, and the edge region of the second encapsulation layer 200 can be all combined with the transition layer 400, thus further improving the adhesion of the edge region of the second encapsulation layer 200 on the substrate 1000 and increasing the encapsulation yield of the substrate 1000.

Figure 3A:
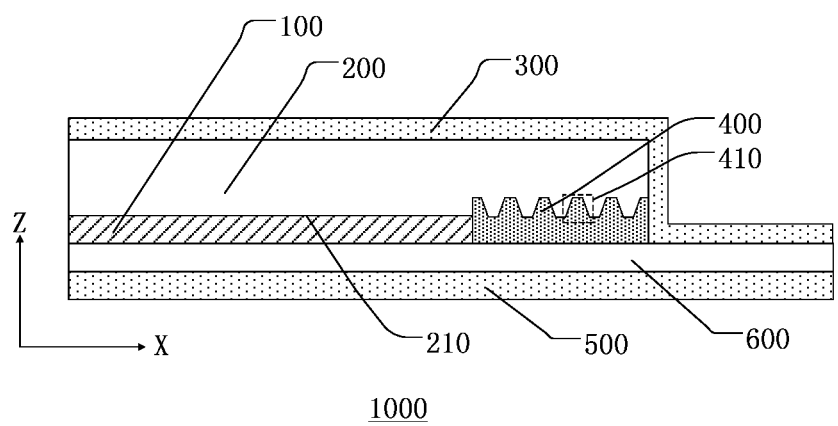
FIG. 3A is a cross-sectional view of another substrate according to an embodiment of the present disclosure.
Figure 3B:
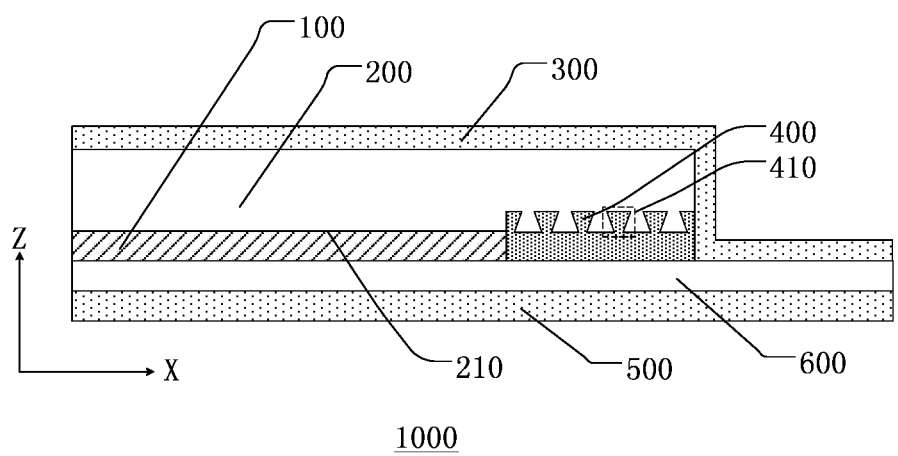
FIG. 3B is a cross-sectional view of another substrate according to an embodiment of the present disclosure.

For example, in the substrate provided by at least one embodiment of the present disclosure, a surface of the transition layer in contact with the first main surface is provided with at least one concave-convex structure. FIG. 3A is a cross-sectional view of another substrate 1000 provided by an embodiment of the present disclosure, and FIG. 3B is a cross-sectional view of another substrate 1000 provided by an embodiment of the present disclosure. For example, as shown in FIG. 3A and FIG. 3B, the surface of the transition layer 400 in contact with the second region 212 may be provided with at least one concave-convex structure 410 (a portion of the transition layer 400 located in the dashed box). The concave-convex structure 410 can increase a contact area between the transition layer 400 and the second encapsulation layer 200, thus increasing the bonding force between the transition layer 400 and the second encapsulation layer 200.

In at least one embodiment of the present disclosure, the arrangement of the concave-convex structure on the transition layer is not limited as long as the arrangement of the concave-convex structure can increase the contact area between the transition layer and the second encapsulation layer. For example, the concave-convex structure is arranged in multiple layers in a direction from an edge of the first main surface to a center of the first main surface. As shown in FIG. 3A and FIG. 3B, there may be a plurality of concave-convex structures 410, which are arranged in multiple layers in the direction from the edge of the second encapsulation layer 200 to the center of the second encapsulation layer 200. As such, the contact area between the edge portion of the second encapsulation layer 200 and the transition layer 400 can be further increased, the bonding force between them can be increased, and the separation of the second encapsulation layer 200 from the substrate 1000 can be prevented.

In at least one embodiment of the present disclosure, a planar shape of the concave-convex structure is not limited. For example, in the substrate provided by at least one embodiment of the present disclosure, the concave-convex structure may be a closed ring. For example, the first encapsulation layer is located within the concave-convex structure of a closed ring. For example, further, in the case where the concave-convex structure is in a multi-layer arrangement, the plurality of concave-convex structure layers may be arranged in a concentric ring. For example, in the substrate provided by at least one embodiment of the present disclosure, the concave-convex structure may be a non-closed ring, a line segment, or the like. For example, in the substrate provided by at least one embodiment of the present disclosure, a plurality of concave-convex structures are provided, and the concave-convex structures may be distributed on a surface of the transition layer in a dot-matrix manner. For example, in a direction parallel to the plane where the substrate is located, the cross-sectional shape of the concave-convex structure arranged in a dot-matrix manner may include at least one of a circle, a triangle, a rectangle, a polygon, and the like.

In at least one embodiment of the present disclosure, the cross-sectional shape of the concave-convex structure is not limited. For example, in the substrate provided by at least one embodiment of the present disclosure, the cross-sectional shape of the concave-convex structure may include one or a combination of an arc, a rectangle, a trapezoid, an inverted trapezoid, and the like in a direction perpendicular to the plane where the substrate is located. For example, in some embodiments of the present disclosure, as shown in FIG. 3A, the cross-sectional shape of the concave-convex structure 410 is a trapezoid in the z-axis direction. For example, in other embodiments of the present disclosure, as shown in FIG. 3B, the cross-sectional shape of the concave-convex structure 410 is an inverted trapezoid in the z-axis direction.

In at least one embodiment of the present disclosure, a forming manner of the concave-convex structure 410 is not limited. For example, a material forming the concave-convex structure 410 may be a photoresist, and the concave-convex structure may be formed by a photolithographic patterning process using a mask. For example, a mask pattern in the mask may correspond to positions where two sides of the concave-convex structure 410 are located. However, in the exposure process, in an edge region of the mask pattern (e.g., corresponding to a region where the two sides of the trapezoidal concave-convex structure 410 are located), the light used for exposure may interfere, be scattered or the like, thus resulting in uneven exposure of the photoresist material in the region where the two sides of the concave-convex structure 410 are located. After etching, the two sides of the concave-convex structure 410 are usually inclined surfaces. In the actual process, the inclined surface is usually an arc-shaped surface. By selecting a property of the photoresist (positive photoresist or negative photoresist) and the specific process, a trapezoidal concave-convex structure 410 as shown in FIG. 3A or an inverted trapezoidal concave-convex structure 410 as shown in FIG. 3B may be formed respectively, and the embodiments of the present disclosure are not repeated herein.

For example, in at least one embodiment of the present disclosure, as shown in FIG. 3B, the cross-sectional shape of the concave-convex structure 410 is an inverted trapezoid. As such, not only can the contact area between the second encapsulation layer 200 and the transition layer 400 be increased, but also the risk of separation of the second encapsulation layer 200 from the substrate can be further reduced after the concave-convex structure 410 of this shape is embedded in the second encapsulation layer 200. For the above-mentioned substrate 1000, even after it is subjected to an external force, the interface between the second encapsulation layer 200 and the transition layer 400 is separated, and the width of the end of the concave-convex structure 410 away from the base 500 is greater than the width of the end of the concave-convex structure 410 close to the base 500, making it difficult to separate the concave-convex structure 410 from the second encapsulation layer 200. As a consequence, the transition layer 400 can provide the second encapsulation layer 200 with a tensile force, which prevents the second encapsulation layer 200 from being separated from the substrate 1000.

For example, in at least one embodiment of the present disclosure, the substrate may further include a dielectric layer disposed at a side of the transition layer away from the second encapsulation layer, and the bonding strength between the dielectric layer and the transition layer is greater than the bonding strength between the dielectric layer and the first encapsulation layer. For example, as shown in FIG. 3B, a dielectric layer 600 is disposed between the base 500 and the transition layer 400. The binding force between the dielectric layer 600 and the transition layer 400 is great, which can play a transition role between the transition layer 400 and the base 500 and prevent the transition layer 400 from being separated from the substrate 1000.

For example, in at least one embodiment of the present disclosure, the preparation material of the dielectric layer may include an organic material such as epoxy resin, polyimide, polyamide, acrylic acid or other suitable materials. As such, the preparation materials of the dielectric layer and the transition layer both include the organic material, and the bonding force between them is great. The transition layer is tightly combined with the dielectric layer to be fixed on the substrate, so that the second encapsulation layer can be firmly fixed on the substrate.

For example, in at least one embodiment of the present disclosure, the dielectric layer may be provided as a structural layer in the substrate. Illustratively, taking the substrate in the embodiments of the present disclosure as a display substrate (e.g., OLED display substrate) as an example, the dielectric layer may be one of a buffer layer, a gate insulating layer, an interlayer dielectric layer, a passivation layer, a planarization layer, and a pixel defining layer in the substrate. Thus, the preparation process of the substrate can be simplified, and the thin and light design of the substrate is facilitated.

For example, in at least one embodiment of the present disclosure, the transition layer may be disposed in the same layer and made of the same material as the structural layer in the substrate. Illustratively, taking the substrate in the embodiments of the present disclosure as a display substrate (e.g., OLED display substrate) as an example, the transition layer may be configured to be disposed in the same layer and made of the same material as one or more of a gate insulating layer, an interlayer dielectric layer, a passivation layer, a planarization layer, and a pixel defining layer in the substrate.

For example, in at least one embodiment of the present disclosure, the substrate may further include a third encapsulation layer disposed at a side of the second encapsulation layer away from the first main surface, and the preparation materials of the first encapsulation layer and the third encapsulation layer include inorganic materials. Illustratively, as shown in FIG. 3B, the third encapsulation layer 300 is disposed on the second encapsulation layer 200. A preparation material of the third encapsulation layer 300 includes an inorganic material such as silicon nitride, silicon oxide, silicon oxynitride or other suitable materials. The inorganic material has a high compactness, which can prevent water, oxygen, and the like from invading the interior of the substrate 1000.

For example, in at least one embodiment of the present disclosure, an orthographic projection of the second encapsulation layer on the plane where the substrate is located and an orthographic projection of the transition layer on the plane where the substrate is located are both located within the orthographic projection of the third encapsulation layer on the plane where the substrate is located. Illustratively, as shown in FIG. 3B, the third encapsulation layer 300 completely covers the second encapsulation layer 200 and the transition layer 400, so that external water, oxygen and the like can be prevented from invading the interior of the substrate 1000 through the transition layer 400 or the interface between the transition layer 400 and other structures (e.g., the second encapsulation layer 200 or the dielectric layer 600).

For example, in at least one embodiment of the present disclosure, the substrate may further include a barrier dam located at a side of the transition layer away from the first encapsulation layer, an orthographic projection of the barrier dam on the plane where the substrate is located is located within the orthographic projection of the third encapsulation layer on the plane where the substrate is located, and at least a portion of the barrier dam is disposed in the same layer and made of the same material as the transition layer.

Figure 4:
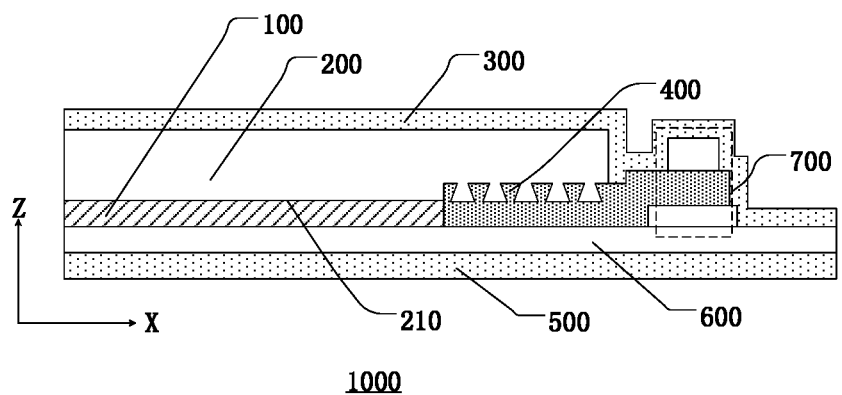
FIG. 4 is a cross-sectional view of another substrate according to an embodiment of the present disclosure.

FIG. 4 is a cross-sectional view of another substrate provided by an embodiment of the present disclosure. For example, in at least one embodiment of the present disclosure, as shown in FIG. 4, an edge region of the substrate 1000 may be provided with a barrier dam 700 (a portion of the substrate 1000 in FIG. 4 that is located in a dashed box), the barrier dam 700 is located at a side of the transition layer 400 away from the first encapsulation layer 100, and the orthographic projection of the barrier dam 700 on the plane where the substrate 1000 is located is located within the orthographic projection of the third encapsulation layer 300 on the plane where the substrate 1000 is located. The third encapsulation layer 300 may cover the barrier dam 700, thus increasing the path for water, oxygen and the like to invade the interior of the substrate 1000 and improving the encapsulation effect of the substrate 1000. For example, the barrier dam 700 may be disposed as an annular closed structure, or the barrier dam 700 may be disposed as having multiple layers from inside to outside at the edge of the substrate 1000, to improve the encapsulation effect of the substrate 1000.

For example, as shown in FIG. 4, the barrier dam 700 may be disposed in the same layer and made of the same material as the structural layer in the substrate 1000. For example, as shown in FIG. 4, at least a portion of the barrier dam 700 is disposed in the same layer and made of the same material as the transition layer 400. Illustratively, taking the substrate 1000 in the embodiments of the present disclosure as a display substrate 1000 (e.g., OLED display substrate 1000) as an example, the barrier dam 700 may be configured to be disposed in the same layer and made of the same material as one or a combination of a gate insulating layer, an interlayer dielectric layer, a passivation layer, a planarization layer, and a pixel defining layer in the substrate 1000. Furthermore, in the process of forming the transition layer 400, a portion of a material layer for forming the transition layer 400 may be extended to a design area of the barrier dam 700, a portion of the material layer overlapping with the second encapsulation layer 200 is the transition layer 400, and a portion of the material layer located in the design area of the barrier dam 700 serves as at least a portion of the structure of the barrier dam 700. Thus, there is no need to add manufacturing process for preparing the substrate 1000; the process is simplified, the cost is reduced, and the thin and light design of the substrate 1000 is facilitated.

For example, in at least one embodiment of the present disclosure, as shown in FIG. 4, the transition layer 400 may also be disposed in the same layer and made of the same material as one of the structural layers in the barrier dam 700, or the transition layer 400 and one of the structural layers in the barrier dam 700 are integrally formed, thus further simplifying the preparation process of the substrate 1000. Illustratively, a portion of the gate insulating layer, the interlayer dielectric layer, and the passivation layer in the substrate 1000 located at the edge of the substrate 1000 is provided as the barrier dam 700, and accordingly, another portion of the interlayer dielectric layer in the substrate 1000 located at the edge of the substrate 1000 may also be simultaneously provided as the transition layer 400. As such, the manufacturing process of the substrate 1000 can be further simplified, and the design difficulty of the edge portion of the substrate 1000 can be reduced.

In at least one embodiment of the present disclosure, a thickness difference between the second encapsulation layer and, for example, the transition layer, may be appropriately reduced, i.e., the stress difference between the second encapsulation layer and the transition layer may be reduced to prevent the second encapsulation layer from being separated from the substrate. For example, in at least one embodiment of the present disclosure, in the second region, a ratio of the thickness of the transition layer to the thickness of the second encapsulation layer may be from 1/6 to 1/3, for example, further 1/5, 1/4, etc.

Figure 5:
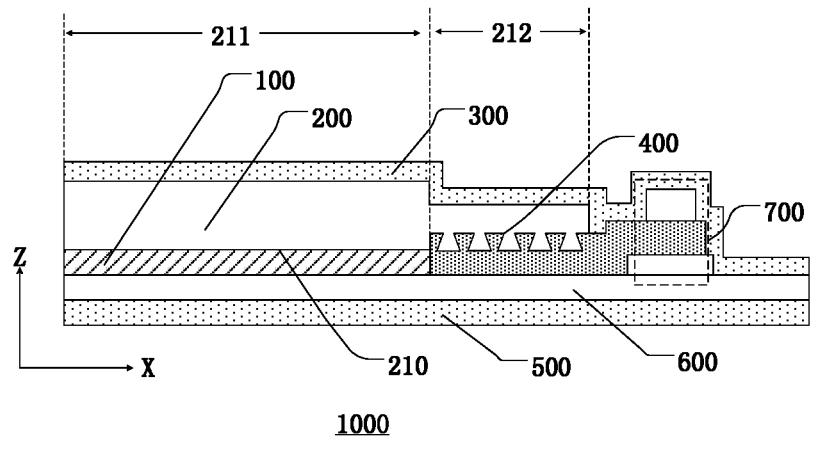
FIG. 5 is a cross-sectional view of another substrate according to an embodiment of the present disclosure.

FIG. 5 is a cross-sectional view of another substrate provided by an embodiment of the present disclosure. For example, as shown in FIG. 5, the thickness of the second encapsulation layer 200 in the second region 212 is smaller than the thickness of the second encapsulation layer 200 in the first region 211.

In at least one embodiment of the present disclosure, the thicknesses of the first encapsulation layer, the second encapsulation layer, the third encapsulation layer, the transition layer, and the like are not limited. For example, as shown in FIG. 5, in a z-axis direction, the first encapsulation layer 100 may have a thickness of 0.8 to 1.5 microns; the third encapsulation layer 300 may have a thickness of 0.8 to 1.5 microns; the second encapsulation layer 200 in the first region 211 has a thickness of 10 to 12 microns. For example, the transition layer 400 may have a thickness of 0.8 to 3 microns. The thickness of the transition layer 400 is not limited and may be set according to the thickness of the portion of the second encapsulation layer 200 located in the second region 212. Illustratively, the second encapsulation layer 200 in the second region 212 has a thickness of 3 to 6 microns, and the thickness of the transition layer 400 may be set to be about 1 to 2 microns.

At least one embodiment of the present disclosure provides a display panel including the substrate according to any one of the above embodiments. For example, the substrate in the display panel may be a flexible display substrate for application in the field of flexible display. For example, in the display panel provided by at least one embodiment of the present disclosure, a touch substrate may be provided on the display substrate so that the display panel has a touch display function.

For example, the display panel may be applied to any product or component with a display function such as a television, a digital camera, a cellphone, a watch, a tablet PC, a laptop, a navigator, or the like.

At least one embodiment of the present disclosure provides a method for preparing a substrate, comprising: forming a first encapsulation layer, a transition layer and a second encapsulation layer on a base respectively; wherein the first encapsulation layer and the transition layer are formed between the base and the second encapsulation layer and are both in contact with a first main surface of the second encapsulation layer facing the base, the first main surface comprises a first region in contact with the first encapsulation layer and a second region in contact with the transition layer, the second region is located at an edge of the first main surface, and the bonding strength between the transition layer and the second encapsulation layer is greater than the bonding strength between the first encapsulation layer and the second encapsulation layer. In the substrate obtained by the above preparation method, the transition layer can improve the adhesion of the edge portion of the second encapsulation layer, prevent the second encapsulation layer from being separated from the substrate, and improve the encapsulation yield of the substrate.

For example, in the preparation method provided by at least one embodiment of the present disclosure, the preparation materials of the second encapsulation layer and the transition layer both include organic materials. The preparation materials of the second encapsulation layer and the transition layer both include organic materials, and the bonding strength between the organic materials is great, so that the bonding between the second encapsulation layer and the transition layer is firm.

For example, in the preparation method provided by at least one embodiment of the present disclosure, the orthographic projection of the transition layer on the plane where the substrate is located is located outside the orthographic projection of the first encapsulation layer on the plane where the substrate is located. As such, the first encapsulation layer will not affect the bonding between the second encapsulation layer and the transition layer.

For example, in the preparation method provided by at least one embodiment of the present disclosure, the forming the transition layer includes: performing a patterning process on a surface of the transition layer in contact with the second region, to form at least one concave-convex structure. The concave-convex structure can increase the contact area between the transition layer and the second encapsulation layer, thus increasing the bonding force between them.

For example, the preparation method provided by at least one embodiment of the present disclosure further includes: depositing an inorganic material film at a side of the second encapsulation layer away from the substrate to form a third encapsulation layer; the orthographic projection of the second encapsulation layer on the plane where the substrate is located and the orthographic projection of the transition layer on the plane where the substrate is located are both located within the orthographic projection of the third encapsulation layer on the plane where the substrate is located. The preparation material of the third encapsulation layer comprises an inorganic material, has a high compactness, and can prevent water, oxygen and the like from invading the interior of the substrate.

In the embodiments of the present disclosure, reference may be made to the relevant contents in the previous embodiments (the embodiments regarding the substrate) for the specific structure of the substrate obtained by the above preparation method, and the embodiments of the present disclosure will not be described in detail here.

FIG. 6A to FIG. 6D are process diagrams of a method for preparing a substrate according to one embodiment of the present disclosure. By taking the preparation of the substrate shown in FIG. 4 as an example, the process of the preparation method of the substrate will be described in the embodiments shown in FIG. 6A to FIG. 6D.

Figure 6A:
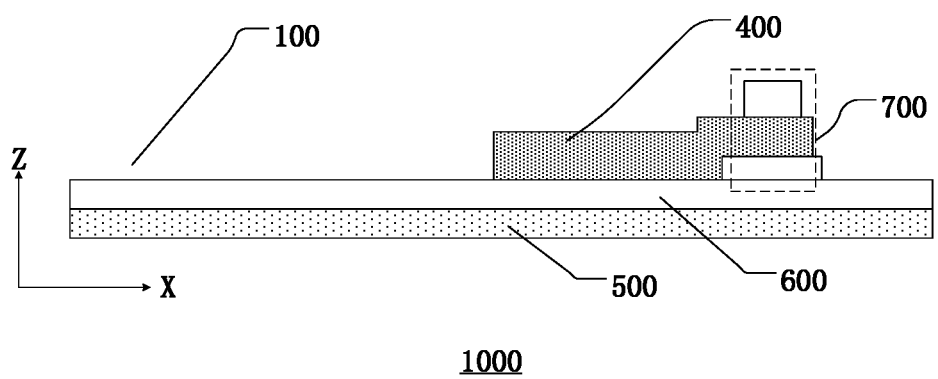
FIG. 6A to FIG. 6D are process diagrams of a method for preparing a substrate according to an embodiment of the present disclosure.

As shown in FIG. 6A, a base 500 is provided, and a film including an organic material is deposited on the base 500, and then the film is subjected to a patterning process to form a transition layer 400. It should be noted that the base 500 may be formed with structures such as a dielectric layer 600 and a barrier dam 700, and the dielectric layer 600 and the barrier dam 700 may be arranged as structural layers in the substrate 1000. In this case, reference may be made to conventional process methods for the preparation process of the dielectric layer 600 and the barrier dam 700, and the embodiments of the present disclosure will not be described in detail herein. For example, as shown in FIG. 4, the transition layer 400 and a certain structural layer in the barrier dam 700 may be integrally formed, so that the structural layer integrally formed with the transition layer 400 of the barrier dam 700 may be synchronously formed in the same patterning process during the above-mentioned preparation of the transition layer 400.

In at least one embodiment of the present disclosure, the preparation material of the base 500 is not limited. For example, the preparation material of the base 500 may be a glass substrate 1000, a quartz substrate 1000, or a resin material including, for example, one or more of polyimide, polycarbonate, polyacrylate, polyetherimide, polyethersulfone, polyethylene terephthalate, polyethylene naphthalate, and the like.

For example, in at least one embodiment of the present disclosure, the patterning process may be a photolithographic patterning process. For example, the photolithographic patterning process may include: coating a photoresist film on a structural layer to be patterned, wherein the photoresist film may be coated by spin coating, knife coating or roll coating; exposing the photoresist layer using a mask, and developing the exposed photoresist layer to obtain a photoresist pattern; etching the structural layer by using the photoresist pattern as a mask; and stripping the remaining photoresist material to form the pattern structure as desired.

Figure 6B:
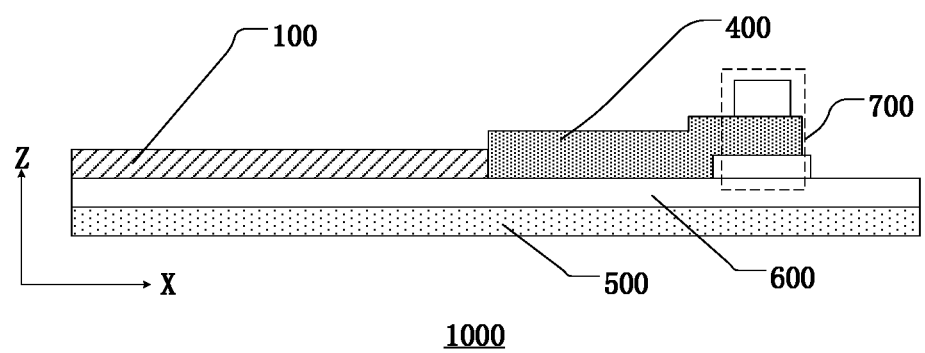

As shown in FIG. 6B, an inorganic material film is deposited on the base 500 to form the first encapsulation layer 100.

Figure 6C:
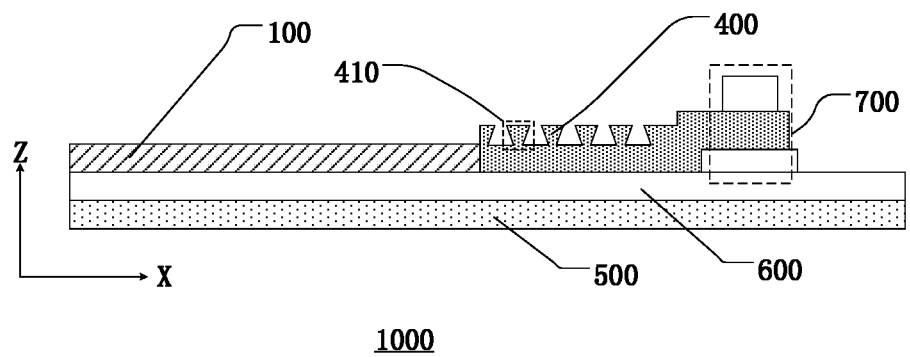

It should be noted that in at least one embodiment of the present disclosure, the first encapsulation layer may be formed first and then the transition layer may be formed. The first forming one of the first encapsulation layer and the transition layer may be selected according to the actual process, and the embodiments of the present disclosure are not described in detail herein. As shown in FIG. 6C, a surface of the transition layer 400 is patterned to form at least one concave-convex structure 410 on the surface of the transition layer 400 away from the base 500. For a shape and a forming method of the concave-convex structure 410, reference may be made to the relevant contents in the previous embodiments (the embodiments regarding the substrate 1000), and will not be described in detail here.

Figure 6D:
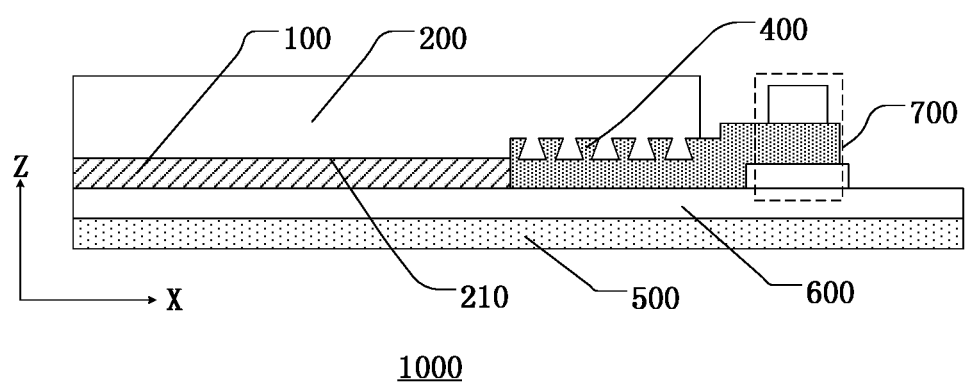

As shown in FIG. 6D, an organic material film is deposited on the base 500 and subjected to a patterning process to form a second encapsulation layer 200. It should be noted that in the process of preparing the second encapsulation layer 200, a portion of an edge region of the second encapsulation layer 200 may be etched to reduce a thickness of the portion of the second encapsulation layer 200 overlapping with the transition layer 400, for example.

As shown in FIG. 4, an inorganic material film is deposited at a side of the second encapsulation layer 200 away from the base 500 to form a third encapsulation layer 300; the orthographic projection of the second encapsulation layer 200 on the plane where the substrate 1000 is located and the orthographic projection of the transition layer 400 on the plane where the substrate 1000 is located are both located within the orthographic projection of the third encapsulation layer 300 on the plane where the substrate 1000 is located.

At least one embodiment of the present disclosure provides an encapsulation structure, comprising an encapsulation layer and a transition layer, the encapsulation layer comprising a first encapsulation layer and a second encapsulation layer which are laminated with each other. The first encapsulation layer is located on the first main surface of the second encapsulation layer, and the transition layer and the first encapsulation layer are juxtaposed on the first main surface. The first main surface includes a first region in contact with the first encapsulation layer and a second region in contact with the transition layer, the second region is located at an edge of the first main surface, and the bonding strength between the transition layer and the second encapsulation layer is greater than the bonding strength between the first encapsulation layer and the second encapsulation layer. The transition layer can improve the adhesion of the edge portion of the second encapsulation layer and prevent the second encapsulation layer from being separated from the substrate, thus improving the encapsulation yield of the substrate. The structure of the encapsulation structure may be described as in the previous embodiment (e.g., the substrate in FIG. 2) and will not be described in detail here.

At least one embodiment of the present disclosure provides an encapsulation structure, a substrate and a display panel, and may have at least one of the following beneficial effects:

(1) In the substrate provided by at least one embodiment of the present disclosure, a transition layer is arranged at an edge of the second encapsulation layer, and the bonding strength between the transition layer and the second encapsulation layer is greater than the bonding strength between the first encapsulation layer and the second encapsulation layer, so that the adhesion of the edge portion of the second encapsulation layer can be improved, the separation of the second encapsulation layer from the substrate can be prevented, and the encapsulation yield of the substrate can be improved.

(2) In the substrate provided by at least one embodiment of the present disclosure, the surface of the transition layer in contact with the second region of the second encapsulation layer is provided with at least one concave-convex structure, which increases the contact area between the transition layer and the second encapsulation layer and can increase the bonding force between them.

(3) In the substrate provided by at least one embodiment of the present disclosure, a dielectric layer is provided at a side of the transition layer away from the second encapsulation layer, and the bonding strength between the dielectric layer and the transition layer is great, which can play a transition role between the transition layer and the base and prevent the transition layer from being separated from the substrate.

For the present disclosure, the following points need to be explained:

(1) The drawings of the embodiments of the present disclosure only refer to the structures involved in the embodiments of the present disclosure, and for other structures, reference may be made to the general design.

(2) For the sake of clarity, in the drawings used to describe the embodiments of the present disclosure, the thickness of layers or regions is zoomed in or out, i.e., these drawings are not drawn according to actual scale.

(3) Without conflict, the embodiments of the present disclosure and the features in the embodiments can be combined with each other to obtain new embodiments.

The above is only a specific embodiment of the present disclosure, but the scope of protection of the present disclosure is not limited thereto. The scope of protection of the present disclosure shall be based on the scope of protection of the claims.

What is claimed is:

1. A substrate, comprising a base and an encapsulation structure, the encapsulation structure being located on the base, the encapsulation structure comprising:
   an encapsulation layer, comprising a first encapsulation layer and a second encapsulation layer, wherein the first encapsulation layer and the second encapsulation layer are sequentially laminated on the base, the first encapsulation layer is located on a first main surface of the second encapsulation layer; and
   a transition layer, juxtaposed with the first encapsulation layer on the first main surface;
   wherein the first main surface includes a first region in contact with the first encapsulation layer and a second region in contact with the transition layer, the second region is located at an edge of the first main surface, and a bonding strength between the transition layer and the second encapsulation layer is greater than a bonding strength between the first encapsulation layer and the second encapsulation layer.

2. The substrate according to claim 1, wherein an orthographic projection of the transition layer on a plane where the substrate is located is located outside an orthographic projection of the first encapsulation layer on the plane where the substrate is located.

3. The substrate according to claim 1, wherein materials of the second encapsulation layer and the transition layer both include organic materials.

4. The substrate according to claim 1, wherein an orthographic projection of the second region on the plane where the substrate is located is in a closed ring shape, and an orthographic projection of the first region on the plane where the substrate is located is located within the orthographic projection of the second region on the plane where the substrate is located.

5. The substrate according to claim 1, wherein a surface of the transition layer in contact with the first main surface is provided with at least one concave-convex structure.

6. The substrate according to claim 5, wherein the concave-convex structure is arranged in multiple layers in a direction from an edge of the first main surface to a center of the first main surface.

7. The substrate according to claim 5, wherein in a direction perpendicular to the plane where the substrate is located, a cross-sectional shape of the concave-convex structure includes one or a combination of an arc, a rectangle, a trapezoid and an inverted trapezoid.

8. The substrate according to claim 1, further comprising:
   a dielectric layer, disposed at a side of the transition layer away from the second encapsulation layer,
   wherein a bonding strength of the dielectric layer and the transition layer is greater than a bonding strength of the dielectric layer and the first encapsulation layer.

9. The substrate according to claim 8, wherein a preparation material of the dielectric layer comprises an organic material, and the dielectric layer is one of a buffer layer, a gate insulating layer, an interlayer dielectric layer, a passivation layer, a planarization layer and a pixel defining layer in the substrate.

10. The substrate according to claim 1, wherein the transition layer is configured to be disposed in a same layer and made of a same material as one or a combination of a gate insulating layer, an interlayer dielectric layer, a passivation layer, a planarization layer and a pixel defining layer in the substrate.

11. The substrate according to claim 1, wherein in the second region, a ratio of a thickness of the transition layer to a thickness of the second encapsulation layer is 1/6 to 1/3.

12. The substrate according to claim 1, further comprising:
   a third encapsulation layer, disposed at a side of the second encapsulation layer away from the first main surface,
   wherein materials of the first encapsulation layer and the third encapsulation layer comprise inorganic materials.

13. The substrate according to claim 12, wherein an orthographic projection of the second encapsulation layer on a plane where the substrate is located and an orthographic projection of the transition layer on the plane where the substrate is located are both located within an orthographic projection of the third encapsulation layer on the plane where the substrate is located.

14. The substrate according to claim 12, further comprising:
   a barrier dam, located at a side of the transition layer away from the first encapsulation layer,
   wherein an orthographic projection of the barrier dam on a plane where the substrate is located is located within an orthographic projection of the third encapsulation layer on the plane where the substrate is located, and at least a portion of the barrier dam is disposed in a same layer and made of a same material as the transition layer.

15. A display panel, comprising the substrate according to claim 1.

16. An encapsulation structure, comprising:
   an encapsulation layer, comprising a first encapsulation layer and a second encapsulation layer, the first encapsulation layer and the second encapsulation layer being laminated with each other, the first encapsulation layer being located on a first main surface of the second encapsulation layer; and
   a transition layer, juxtaposed with the first encapsulation layer on the first main surface;
   wherein the first main surface includes a first region in contact with the first encapsulation layer and a second region in contact with the transition layer, the second region is located at an edge of the first main surface, and a bonding strength between the transition layer and the second encapsulation layer is greater than a bonding strength between the first encapsulation layer and the second encapsulation layer.

17. The encapsulation structure according to claim 16, wherein an orthographic projection of the transition layer on the first main surface is located outside an orthographic projection of the first encapsulation layer on the first main surface.

18. The encapsulation structure according to claim 16, wherein materials of the second encapsulation layer and the transition layer both include organic materials.

19. The encapsulation structure according to claim 16, wherein an orthographic projection of the second region on the first main surface is in a closed ring shape, and an orthographic projection of the first region on a plane where the substrate is located is located within an orthographic projection of the second region on the first main surface.

20. The encapsulation structure according to claim 16, wherein
a surface of the transition layer in contact with the first main surface is provided with at least one concave-convex structure.

\* \* \* \* \*

UNITED STATES PATENT AND TRADEMARK OFFICE
CERTIFICATE OF CORRECTION

PATENT NO. : 10,680,204 B2  
APPLICATION NO. : 16/476402  
DATED : June 9, 2020  
INVENTOR(S) : Zi Qiao and Zhiliang Jiang Page 1 of 1

It is certified that error appears in the above-identified patent and that said Letters Patent is hereby corrected as shown below:

On the Title Page

Insert:
-- (30) Foreign Application Priority Data
December 15, 2017 (CN) ........................ 201711353503.7 --.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*